(12) United States Patent
Asano et al.

(10) Patent No.: US 8,368,096 B2
(45) Date of Patent: Feb. 5, 2013

(54) SOLID STATE IMAGE PICK-UP DEVICE AND METHOD FOR MANUFACTURING THE SAME WITH INCREASED STRUCTURAL INTEGRITY

(75) Inventors: Osamu Asano, Kyoto (JP); Hitoo Iwasa, Osaka (JP); Sumio Terakawa, Osaka (JP); Masami Shouji, Osaka (JP)

(73) Assignee: AAC Technologies Japan R&D Center Co., Ltd., Osaka (JP)

( * ) Notice: Subject to any disclaimer, the term of this patent is extended or adjusted under 35 U.S.C. 154(b) by 660 days.

(21) Appl. No.: 11/813,242

(22) PCT Filed: Dec. 27, 2005

(86) PCT No.: PCT/JP2005/023875
§ 371 (c)(1),
(2), (4) Date: Jul. 2, 2007

(87) PCT Pub. No.: WO2006/073085
PCT Pub. Date: Jul. 13, 2006

(65) Prior Publication Data
US 2008/0042227 A1   Feb. 21, 2008

(30) Foreign Application Priority Data
Jan. 4, 2005   (JP) .................................. 2005-000001

(51) Int. Cl.
*H01L 33/00* (2010.01)
(52) U.S. Cl. .......................................... 257/98; 257/434
(58) Field of Classification Search .................. 257/434, 257/98, 642
See application file for complete search history.

(56) References Cited

U.S. PATENT DOCUMENTS

| | | | | |
|---|---|---|---|---|
| 5,479,049 A | * | 12/1995 | Aoki et al. | 257/642 |
| 5,622,883 A | * | 4/1997 | Kim | 438/396 |
| 5,786,589 A | * | 7/1998 | Segawa et al. | 250/208.1 |
| 6,011,294 A | * | 1/2000 | Wetzel | 257/434 |
| 6,583,030 B1 | | 6/2003 | Grassl | |

(Continued)

FOREIGN PATENT DOCUMENTS

| | | |
|---|---|---|
| CN | 1320325 | 10/2001 |
| CN | 1542931 | 11/2004 |

(Continued)

*Primary Examiner* — Ori Nadav
(74) *Attorney, Agent, or Firm* — Lucas & Mercanti, LLP

(57) ABSTRACT

There are provided image pickup devices capable of significantly increasing production yield and ensuring long-term reliability and a method for manufacturing the image pickup devices. This invention is characterized in that it has a large number of light-receiving portions 2 formed at a surface portion of a wafer 1 and a microlens 3 formed for each of the light-receiving portions, through electrodes 4 for performing supply of power to the light-receiving portions 2 and passing and reception of an electrical signal are provided all over the periphery of the wafer 1, one end of each through electrode 4 is connected to an electrode pad 4a which is connected to a wire leading to a light-receiving element at the surface portion of the wafer 1, the other end is connected to a wire through a back electrode 5, a rib 7 which serves as a partition portion arranged to surround the microlenses 3 on four sides is provided on the surface of the wafer 1, a transparent plate 8 of optical glass or the like is bonded to an upper surface of the rib 7 with adhesive, and a protective frame 10 is provided at a junction between the rib 7 and the transparent plate 8.

16 Claims, 11 Drawing Sheets

U.S. PATENT DOCUMENTS

| | | | |
|---|---|---|---|
| 6,703,689 B2 * | 3/2004 | Wada | 257/621 |
| 7,091,599 B2 * | 8/2006 | Fujimori | 257/692 |
| 7,221,051 B2 | 5/2007 | Ono et al. | |
| 2004/0130640 A1 * | 7/2004 | Fujimori | 348/294 |
| 2006/0071152 A1 | 4/2006 | Ono | |

FOREIGN PATENT DOCUMENTS

| | | |
|---|---|---|
| DE | 19853703 A1 | 5/2000 |
| JP | 61-267363 | 11/1986 |
| JP | 62-140433 Y | 6/1987 |
| JP | 03-225867 | 10/1991 |
| JP | H04-246967 A | 9/1992 |
| JP | 05-075934 | 3/1993 |
| JP | 6-160776 Y | 6/1994 |
| JP | 06-252450 | 9/1994 |
| JP | 10-022487 | 1/1998 |
| JP | 10-270672 | 10/1998 |
| JP | 11-111959 | 4/1999 |
| JP | 2001-35972 A | 2/2001 |
| JP | 2001-351997 | 12/2001 |
| JP | 2002-231920 A | 8/2002 |
| JP | 2002-231921 A | 8/2002 |
| JP | 2002-329850 | 11/2002 |
| JP | 2003-031520 Y | 1/2003 |
| JP | 2003031520 A * | 1/2003 |
| JP | 2003-060176 Y | 2/2003 |
| JP | 2003-100998 A | 4/2003 |
| JP | 2003-163342 | 6/2003 |
| JP | 2004-063786 A | 2/2004 |
| JP | 2004-207461 Y | 7/2004 |
| JP | 2004-312666 | 11/2004 |
| JP | 2004-349463 | 12/2004 |
| JP | 2005-209967 A | 8/2005 |
| JP | 2005-285848 | 10/2005 |
| JP | 2005-316111 | 11/2005 |
| JP | 2006-108285 A | 4/2006 |
| WO | 01/15433 | 3/2001 |

* cited by examiner

SOLID STATE IMAGE PICK-UP DEVICE AND METHOD FOR MANUFACTURING THE SAME WITH INCREASED STRUCTURAL INTEGRITY

TECHNICAL FIELD

The present invention relates to a solid-state image pickup device using wafer level chip size packaging technology and a method for manufacturing the same.

BACKGROUND ART

A solid-state image pickup device (hereinafter also simply referred to as an "image pickup device") is obtained by forming an image sensor and an optical element such as a microlens on a semiconductor substrate (hereinafter referred to as a "wafer") and hermetically sealing them and is used as a light-receiving sensor for video equipment such as a video camera, digital camera, or mobile phone camera.

For the purpose of reduction in size and increase in density, image pickup devices of recent years adopt a packaging technology called "wafer level chip size packaging (hereinafter also simply referred to as "wafer level CSP")" for completing a wiring step and a step of bonding a protective member before cutting a wafer and cutting the wafer into chips for chip formation (hereinafter referred to as "separation into individual pieces") (e.g., Patent Documents 1 and 2).

A conventional solid-state image pickup device which uses wafer level CSP generally has a flat transparent plate (transparent flat plate) above a light-receiving portion of an image sensor. The transparent plate is joined to a partition portion (rib) which surrounds the light-receiving portion on four sides with adhesive whose viscosity is appropriately adjusted, and the light-receiving portion including an optical element such as a microlens is hermetically sealed in a void formed between the rib and the transparent plate (Patent Documents 1 to 4).

Note that there is also available a solid-state image pickup device which does not use wafer level CSP, includes a transparent resin film having a flat interface on a microlens instead of a transparent plate, and exhibits an aspect of a microlens characterized in that the relation 1<n1<n2 holds, letting n2 be the refractive index of the microlenses and n1 be the refractive index of the transparent resin film (Patent Document 5).

Patent Document 1: Japanese Patent Laid-Open No. 2003-163342 (e.g., FIGS. 2 and 7)
Patent Document 2: Japanese Patent Laid-Open No. 2005-285848 (e.g., FIGS. 2 and 3)
Patent Document 3: Japanese Patent Laid-Open No. 2001-351997 (e.g., FIG. 1)
Patent Document 4: Japanese Patent Laid-Open No. 2002-329850 (e.g., FIG. 2)
Patent Document 5: Japanese Patent Laid-Open No. 2005-316111 (e.g., FIG. 1)

However, in the case of a structure which has a transparent plate above a light-receiving portion, since the transparent plate and a rib are bonded together with adhesive, an insufficient amount of adhesive leads to a problem in terms of long-term reliability. More specifically, the adhesion is insufficient, an external shock weakens the joining strength, and the transparent plate and rib are disjoined after long-term use. On the other hand, use of a large amount of adhesive may lead to intrusion of excess adhesive into the light-receiving portion (hermetically sealed region) adjacent to the rib and degrade the optical properties.

For this reason, conventional wafer level CSP has low long-term reliability or low production yield. Even if the amount used of adhesive is appropriate, a solid-state image pickup device which uses conventional wafer level CSP is susceptible to an external shock, and no provision is made against shocks.

DISCLOSURE OF THE INVENTION

The present invention has been made in consideration of the above-described circumstances, and has as its technical objective to provide image pickup devices capable of significantly increasing production yield and ensuring long-term device reliability and a method for manufacturing the image pickup devices.

A first solid-state image pickup device according to the present invention is characterized in that the device has a large number of light-receiving portions 2 formed at a surface portion of a wafer 1 and a microlens 3 formed for each of the light-receiving portions 2, through electrodes 4 for performing supply of power to the light-receiving portions 2 and passing and reception of an electrical signal are provided all over a periphery of the wafer 1, one end of each through electrode 4 is connected to an electrode pad 4a which is connected to a wire leading to a light-receiving element at the surface portion of the wafer 1, the other end is connected to a wire through a back electrode 5, a rib 7 which serves as a partition portion arranged to surround the microlenses 3 on four sides is provided on a surface of the wafer 1, a transparent plate 8 of optical glass or the like is bonded to an upper surface of the rib 7 with adhesive, and a protective frame 10 is provided at a junction between the rib 7 and the transparent plate 8.

A recess 11 may be further formed in an inside of the protective frame 10 near the junction between the rib 7 and the transparent plate 8.

The protective frame 10 is preferably composed of a member which does not impair the optical performance of an image sensor such as a light absorber (preferably black rubber or flexible resin mixed with graphite or the like). Alternatively, the protective frame 10 may be composed of a metal containing a light metal such as aluminum.

A second solid-state image pickup device according to the present invention is characterized in that the device has a plurality of light-receiving portions 2 formed at a surface portion of a wafer 1 and a microlens 3 formed for each of the light-receiving portions 2, through electrodes 4 for performing supply of power to the light-receiving portions 2 and passing and reception of an electrical signal are provided all over a periphery of the wafer 1, one end of each through electrode 4 is connected to an electrode pad 4a which is connected to a wire leading to a light-receiving element at the surface portion of the wafer 1, the other end is connected to a wire through a back electrode 5, and a transparent material 23 with a refractive index lower than a refractive index of the microlenses 3 is provided.

The microlenses 3 are generally formed using an organic resin material with a refractive index of about 1.5. In order to achieve smaller size, higher performance, and higher reliability of an image sensor, it is extremely effective to use an inorganic material for the microlenses 3. The microlenses 3 may be composed of an inorganic insulating film of silicon dioxide, a silicon oxynitride film, a silicon nitride film, or the like or an inorganic metal oxide film of a titanium oxide, a tantalum oxide, zirconium oxide, or the like. Their refractive indexes are approximately 1.5 to 3.0.

As the transparent material 23, there can be used a material which is a translucent low-density dielectric film of a thermoset or UV (ultraviolet) curable transparent resin containing distributed micropores, silicon dioxide, a porous silica film, an organic-inorganic hybrid film, a high polymer, or the like and has a refractive index lower than a refractive index of the microlenses. Their refractive indexes are approximately 1.0 to 1.4.

The transparent material 23 may be composed of a plurality of stacked films.

A first method for manufacturing a solid-state image pickup device according to the present invention is a method for manufacturing the first or second solid-state image pickup device and characterized in that at the time of formation of the through electrode, a hemispherical hole (recess) 13 is formed in advance in a back surface of the wafer 1 by isotropic etching, and a through hole (opening) extending from a bottom of the hole toward an electrode 14 on the surface of the wafer is formed by dry etching, thereby providing the through electrode 4.

A second method for manufacturing a solid-state image pickup device according to the present invention is a method for manufacturing the first or second solid-state image pickup device and characterized in that at the time of formation of the through electrode, a large-diameter cylindrical hole (recess) 15 is formed in advance in a back surface of the wafer 1 by dry etching, and a small-diameter through hole (opening) extending from a bottom of the hole toward the surface of the wafer is formed, thereby providing the through electrode 4.

A third method for manufacturing a solid-state image sensor according to the present invention is a method for manufacturing the first or second solid-state image pickup device and characterized in that at the time of formation of the through electrode, within scope of a wafer process (hereinafter including a wiring step throughout the specification) for an image sensor, a process is performed in advance of forming a trench 16 in the surface of the wafer 1, forming a local oxide film 17, filling the trench with an electrode material to form a wire, and connecting the trench to an electrode pad, and then a substrate is thinned uniformly from a back surface to a lower end of the electrode in the trench 16.

A fourth method for manufacturing a solid-state image pickup device according to the present invention is a method for manufacturing the first or second solid-state image pickup device and characterized in that at the time of formation of the through electrode, within scope of a wafer process for an image sensor, a process is performed in advance of forming a trench 16 in the surface of the wafer 1, forming a local oxide film 17, filling the trench with an electrode material to form a wire, and connecting the wire to an electrode pad, and then formation of the through electrode is completed from a back surface side by forming a hole (recess) extending from a back surface to the trench 16, and the back surface is connected to the electrode pad.

An image pickup device according to the present invention is structurally resistant to an external shock and can ensure long-term device reliability. A method for manufacturing an image pickup device according to the present invention can significantly increase production yield and make manufacturing cost much lower than a conventional method.

Figure 1:
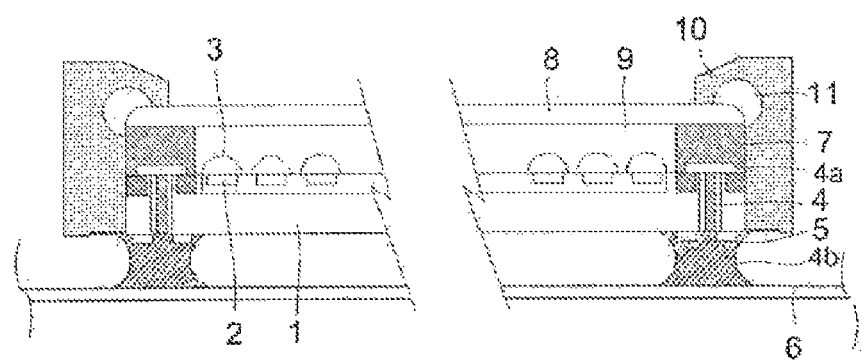
FIG. 1 is a configuration sectional view showing a first basic configuration of an image pickup device according to the present invention.

DESCRIPTION OF SYMBOLS 1 wafer
2 light-receiving portion
3 microlens
4 through electrode
5 back electrode
6 flexible printed circuit board
7 rib
8 transparent plate
9 void
10 protective frame
11 recess
12 protective film
13 hole (recess)
14 wafer surface electrode
15 hole (recess)
16 trench
17 local oxide film
20 scribe line
22 protective film
23 low-refractive-index transparent material
24 recessed portion
25 hooded protective frame
26 all-optical source
27 large-scale integrated circuit device (LSI)
28 protective layer

BEST MODE FOR CARRYING OUT THE INVENTION

First Embodiment

About Basic Configuration of Image Pickup Device

FIG. 1 is a configuration sectional view showing a first basic configuration of an image pickup device according to the present invention. The image pickup device is composed of an image sensor and an optical element and is formed by joining them with joining means such as adhesive. The image sensor is composed of a large number of light-receiving portions and semiconductor devices which bear an image pickup function such as an electrode, a wire, and a protection diode, and the optical element is composed of optical glass, a microlens, and the like. In the image pickup device, a transparent plate is joined to an upper portion of the image sensor with adhesive and is hermetically sealed.

An image pickup device shown in FIG. 1 has a large number of light-receiving portions 2 formed at a surface portion of a wafer 1 and a microlens 3 formed for each of the light-receiving portions 2. Through electrodes 4 are provided all over the periphery of the wafer 1, and supply of power to the light-receiving portions 2 and passing and reception of an electrical signal are performed through the through electrodes 4. One end of each through electrode 4 is connected to an electrode pad 4a which is connected to a wire leading to a light-receiving element at the surface portion of the wafer 1, and the other end is connected to a wire through a back electrode 5. Note that the wire is provided, e.g., on the surface of a flexible printed wiring board 6 and constitutes a part of a driving circuit for the image sensor.

A rib 7 which serves as a partition portion arranged to surround the microlenses 3 on four sides is provided on the surface of the wafer 1. A transparent plate 8 of optical glass or the like is bonded to an upper surface of the rib 7 with adhesive. A light-shielding material is used for the rib. A void 9 is formed between the transparent plate 8 and the microlenses 3. The void 9 is provided to enhance the light focusing effect of the microlenses 3. However, the void 9 may be configured to be filled with a low-refractive-index transparent material, as in a second basic configuration to be described later. The void 9 can also be considered to be filled with air. In this case, the refractive index of air is 1, and the light focusing effect of the microlenses is the maximum.

The microlenses 3 may be made of either an organic material (e.g., resin) or an inorganic material. A high-refractive-index material is more desirable for enhancement of the light focusing effect.

The first embodiment is characterized in that a protective frame 10 is provided at the junction between the rib 7 and the transparent plate 8. The presence of the void 9 in the device is likely to cause the overall mechanical strength of the device to be susceptible to an external shock. The protective frame 10 is provided to cushion an external shock to the image pickup device. A recess 11 may be formed in the inside of the protective frame 10 near the junction between the rib 7 and the transparent plate 8. This is because the recess 11 acts as a space for evacuation of excess adhesive which is left after the upper surface of the rib 7 and the transparent plate 8 are bonded together with adhesive.

The protective frame 10 is preferably composed of a member which does not impair the optical performance of the image sensor such as a light absorber, preferably black rubber or flexible resin mixed with graphite or the like. Alternatively, the protective frame 10 may be composed of a metal containing a light metal such as aluminum. If the protective frame 10 is composed of metal, it is possible to further prevent deterioration in sealing resin and achieve significant improvement in reliability.

—About Modification of Image Pickup Device—

Figure 8:
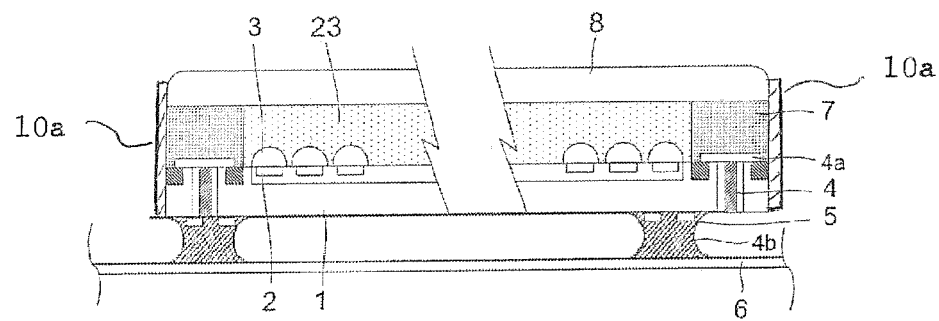
FIG. 8 is a configuration sectional view showing a modification of an image pickup device according to the present invention.

FIG. 8 is a configuration sectional view showing a modification of an image pickup device according to the present invention. The image pickup device is composed of an image sensor and an optical element and generally formed by joining them with joining means such as adhesive. The image sensor is composed of a large number of light-receiving portions and semiconductor devices which bear an image pickup function such as an electrode, a wire, and a protection diode, and the optical element is composed of optical glass, a microlens, and the like. In the image pickup device, a transparent plate is joined to an upper portion of the image sensor with adhesive and is hermetically sealed.

An image pickup device shown in FIG. 8 has the large number of light-receiving portions 2 formed at a surface portion of the wafer 1 and the microlens 3 formed for each of the light-receiving portions 2. The through electrodes 4 are provided all over the periphery of the wafer 1, and supply of power to the light-receiving portions 2 and passing and reception of an electrical signal are performed through the through electrodes 4. One end of each through electrode 4 is connected to the electrode pad 4a, which is connected to a wire leading to a light-receiving element at the surface portion of the wafer 1, and the other end is connected to a wire which is provided on the surface of the flexible printed wiring board 6 through the back electrode 5.

The rib 7, which serves as a partition portion arranged to surround the microlenses 3 on four sides, is provided on the surface of the wafer 1. The transparent plate 8 of optical glass or the like is bonded to an upper surface of the rib 7, as needed. A transparent material 23 with a refractive index lower than that of the microlenses is formed between the transparent plate 8 and the microlenses 3. The rib is not indispensable, as will be described later.

The light focusing effect is determined by the ratio of a refractive index $n_2$ of the microlenses 3 to a refractive index $n_1$ of the transparent material 23 ($n_2/n_1$)

The higher the ratio, the higher the efficiency. For this reason, the microlenses 3 may be made of either an organic material (e.g., resin) or an inorganic material. A high-refractive-index material is more desirable for enhancement of the light focusing effect.

If the microlenses 3 are composed of an inorganic material, for example, an inorganic insulating film of silicon dioxide ($SiO_2$ with a refractive index of about 1.5 to 1.6), a silicon oxynitride film (SiON with a refractive index of about 1.8), a silicon nitride film (SiN with a refractive index of about 2.0), or the like can be used.

Other materials that can be used for the microlenses include inorganic metal oxide films of a titanium oxide ($TiO_2$ with a refractive index of about 2.61 to 2.90 in the case of rutile or about 2.45 to 2.55 in the case of anatase), a tantalum oxide (e.g., $TaO_2$ or $Ta_2O_5$), zirconium oxide ($ZrO_2$), and the like. Organic materials with relatively small refractive indexes such as a hot-melt positive resist and a high-refractive-index polyimide resin have conventionally been used for microlenses. If the microlenses are formed using a high-refractive-index material whose refractive index exceeds, e.g., 2, the range of choices for the transparent material 3 further extends to make a material with a higher refractive index available.

A material with a refractive index lower than that of the microlenses 3 is selected for the transparent material 23. More specifically, it is preferable to use, e.g., a thermoset transparent resin or UV curable transparent resin containing distributed micropores. It is possible to form a homogenous transparent resin whose effective refractive index is theoretically in the range of 1.0 to less than 1.5 (whose refractive index is actually about 1.1 to 1.4) by coating the wafer (wafer before separation into individual pieces) with resin while keeping the thickness of the resin to several µm by a normal spin coat method such that the resin becomes almost uniform across the surface of the wafer and curing the resin by thermal curing at a relative low temperature while pores are enlarging. Use of the low-refractive-index resin makes it possible to maintain high sensitivity with almost no loss of the light focusing effect of the microlenses.

Also, silicon dioxide ($SiO_2$) or a material with a refractive index lower than that of the material for the microlenses 3 which is a low-density dielectric substance with a lower permittivity or a viscous substance such as a high polymer and is translucent, like an interlayer insulating film of multilevel interconnection used in a large-scale semiconductor integrated circuit device (LSI), that lies over the light-receiving portions can, of course, be used as the low-refractive-index transparent material 23 for practical purposes. In addition, even if a protective layer of a hard transparent resin or the like is provided on the low-refractive-index transparent material 23, loss of optical properties due to the difference between layers in refractive index is negligible.

Other available transparent materials 23 need to be translucent low-density dielectric films of silicon dioxide ($SiO_2$), a porous silica film, an organic-inorganic hybrid film, a high polymer, or the like and have refractive indexes lower than that of the microlenses.

If an inorganic material with a higher refractive index is used for the transparent material 23, a film with high moisture resistance and high durability (e.g., an SiN film or SiN—SiON hybrid film) can be used. In this case, a spin-on-glass (SOG) layer and, optionally, an infrared-cut film (IR-cut film) can also be formed and stacked on the film. These insulating films can be said to be made available only by using a material with a refractive index higher than conventionally assumed for the microlenses. Any of the insulating films is highly feasible in that an existing semiconductor manufacturing technique can be used for it without change and is effective.

If the transparent material 23 is composed of a plurality of stacked films, and the top layer is covered with an SOG film, as described above, the top layer also serves as a transparent plate, and the transparent plate 8 (and a step of joining the transparent plate 8 with adhesive) can be omitted. In this case, since a protective layer as an upper layer has the low-refractive-index transparent resin immediately therebelow, whether the refractive index of the protective layer is high or low is insignificant. Even if there is slight variation in the thickness of a low-refractive-index transparent resin or hard transparent resin formed by an appropriate spin coat method between the center and periphery of the wafer, most of chips as CSPs maintain a practical level of uniformity, and the variation does not interfere with light-receiving performance. Note that if the transparent plate is omitted, the surface of the top layer of the transparent material needs to have a certain degree of flatness or more.

In any way, since a portion corresponding to the void in the first embodiment is filled with the low-refractive-index transparent material 23, this aspect inherently has high mechanical strength. For this reason, it is not always necessary to provide the protective frame 10 at the junction between the rib 7 and the transparent plate 8. Needless to say, if the protective frame is provided, the mechanical strength becomes higher. The thickness of the transparent material 23 provided on the microlenses 3 is appropriately designed in consideration of the optical properties.

Use of a high-refractive-index inorganic material for the microlenses, formation of the transparent material 23, and further formation of an SOG film or plasma CVD film on the transparent material 23 to a thickness of, e.g., 500 nm or more, preferably about 1 μm prevents flaws on a chip surface, eliminates the need to bond glass, and contributes to significant reduction in cost and improvement in performance of an image sensor. The structure can also be used for an ordinary image sensor which does not necessarily require a through electrode.

Second Embodiment

About Method for Manufacturing Image Pickup Device

A method for forming a through electrode will be explained first. An image pickup device according to the present invention is characterized by being formed by wafer level CSP. Of wafer level CSP, a through electrode forming step is especially important. To facilitate formation of an electrode extending through a wafer, there has been proposed a method for polishing the back surface and thinning the wafer (e.g., Patent Document 6: WO2004/059740). However, since steps are complicated, and handling of a thin wafer in a processing step after polishing is likely to cause the failure of the wafer or introduction of crystal defects, improvement in steps is desired. The present invention proposes a new method for solving the above-described problem without a back polishing step or by performing polishing or etching at the end of a sequence of steps.

Figure 2:
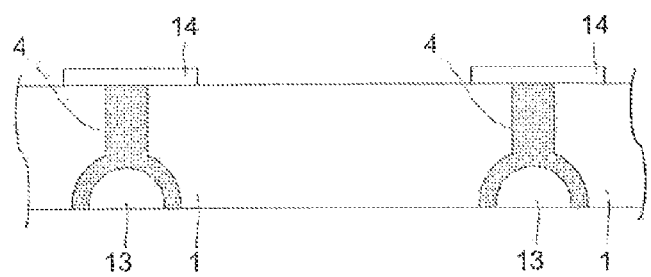
FIGS. 2(a) and 2(b) are each an example of a step sectional view showing a through electrode forming step.
Figure 2:
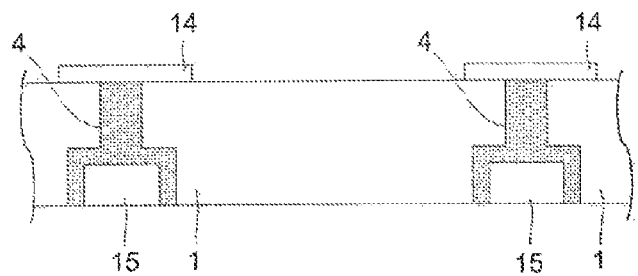

FIGS. 2(a) and 2(b) are each an example of a step sectional view showing a through electrode forming step. The shapes of through electrodes are slightly different due to the difference in formation method.

FIG. 2(a) is an example of a through electrode forming method in which the need for a wafer back polishing step is removed by a combination of wet etching (isotropic etching) and dry etching (anisotropic etching). At the time of through electrode formation, a hemispherical hole (recess) 13 is formed in advance in the back surface of a wafer 1 by wet etching, and a through hole (opening) extending from the bottom of the hole toward an electrode 14 on the surface of the wafer is formed by dry etching, thereby providing a through electrode 4.

The formation of the hemispherical hole (recess) 13 and that of the through hole (opening) may each be performed by a combination of isotropic etching and anisotropic etching. This is because the combination makes it possible to form the small-diameter shallow hole 13 by brief etching and easily form it to have a good shape. Also, formation of the hemispherical hole (recess) 13 allows easy formation of a electrode for lead-out using a pasty insulator and a pasty conductor in the hole at a low cost or ensures and facilitates electrical connection with a wire on the surface of a flexible printed wiring board 6 through a ball-shaped conductor formed of bumps.

FIG. 2(b) is a sectional view of a through electrode forming step as another example which does not require a wafer thinning process. At the time of through electrode formation, a large-diameter cylindrical hole (recess) 15 is formed in advance in the back surface of the wafer 1 by dry etching, and a small-diameter through hole (opening) extending from the bottom of the hole toward the wafer surface is formed, thereby providing the through electrode 4. Both of the large-diameter cylindrical hole (recess) 15 and the small-diameter through hole (opening) can be formed by selective anisotropic etching, dry etching. The functions of the hole (recess) 15 are the same as those of the hole (recess) 13.

Figure 3:
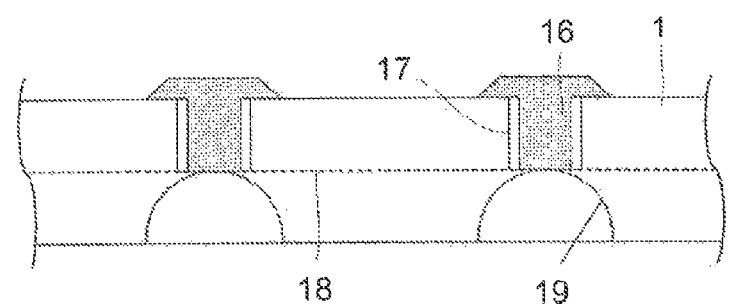
FIG. 3 is a sectional view of a through electrode forming step as another example according to the present invention; a sectional view of a through electrode forming step as another example

FIG. 3 is a sectional view of a through electrode forming step as still another example according to the present invention. At the time of through electrode formation, within the scope of a wafer process for an image sensor, a process is performed in advance of forming a trench 16 in the surface of the wafer 1, forming a local oxide film 17 by, for example, a LOCOS step or a normal insulating film forming step (e.g., an oxide film forming step by high-temperature thermal oxidation or CVD, a chemical oxide film forming step, or a step obtained by combining them), filling the trench with an electrode material to form a wire, and connecting the wire to an electrode pad. After that, by the method shown in FIG. 2(*a*) or 2(*b*), formation of the through electrode is completed from the back surface side by forming a hole (recess) in the back surface, and the back surface is connected to the electrode pad. Note that instead of this, the back surface may be electrically connected to the electrode pad by overall etching from the back surface to a dotted line 18 or forming a bowl-shaped hole (recess) by isotropic etching to a dotted line 19.

Alternatively, the back surface can be polished after the all steps for CSP formation such that the through electrode is exposed.

As described above, if the trench forming step and the LOCOS step or normal insulating film forming step are used, performance of the steps before an image sensor forming step, i.e., a high-temperature diffusion step significantly suppresses occurrence of dry etching damage or crystal defects. This case is far more reasonable than a case where a through electrode is formed in one step using polishing or dry etching from a back surface in that it can prevent or significantly reduce degradation in dark current performance or occurrence of white defects, especially in an image sensor which is extremely sensitive to damage and defects such as a CCD or CMOS sensor.

In the case, for example, a doped polysilicon layer used for a gate electrode in a CCD or MOSLSI or a tungsten (W) layer or tungsten/silicide (W/Si) layer can be used in advance as a conductive layer for a through electrode extending to the dotted line 18. For this layer, e.g., low pressure CVD or plasma CVD can be used.

Note that an electrode pad portion for a wire generally provided outside a region for an image sensor is appropriate to form each through electrode 4. This makes it possible to use an electrode pad of an aluminum alloy or the like provided on the wafer surface side to detect the endpoint of a through hole. However, if the image sensor is an interline charge coupled device (CCD), it is impossible to provide a through electrode at an electrode pad. This is because a CCD region and a signal charge detection portion are formed in a p-type well formed at a surface portion of an n-type wafer, and a p-type region for a protection diode is provided immediately below or around each electrode pad. A voltage (electrical signal) applied to an electrode pad and a through electrode may impair the functions of a protection diode due to, e.g., leakage current between the n-type substrate and the p-type region for the protection diode and impair a function of applying a voltage to a CCD electrode or a signal charge detection function. In this case, it suffices to provide an electrode as an extension at a position off the p-type region for the protection diode and bring the top of the through electrode into contact with the electrode extension, i.e., form the through electrode in an n-type region of the same conductivity type as that of the wafer.

Alternatively, it is possible to make a region for a protection diode immediately below or around a pad electrode annular or divide the region into a plurality of pieces and form a through electrode inside the annular region or the plurality of divided pieces, in a wafer region excluding the region for the protection diode. This makes it possible to form a through electrode immediately below an electrode pad and bring the through electrode and electrode pad into direct contact with each other. With this structure, it is possible to fulfill the functions of a through electrode to the maximum without generation of leakage current.

If a through electrode is used at an output pad for a signal output portion of a CCD, wiring capacity can be made smaller than a case where a wire connection (lead wire) by thin metal wire connection (wire bonding) is used. This allows increase in sensitivity of an output portion and reduction in noise and achieves the effect of shielding stray noise from an external circuit which increases with size reduction by forming a through electrode in a region of the same conductivity type as that of the wafer. Accordingly, it is possible to achieve high-precision stable device characteristics.

Normal semiconductor device manufacturing processes can be used as the above-described wafer processing steps to electrode formation. More specifically, formation of a trench for forming a buried electrode and formation of an insulating film on an inner surface of the trench are performed for the surface of a wafer before an image sensor is formed on the surface, and formation of a buried electrode in the trench, polishing of the back surface of the wafer, formation of an electrode for a predetermined wire, and the like are performed as normal wafer processing steps in the course of a diffusion step generically called a semiconductor process. Manufacturing steps specific to an image pickup device (optical element formation) such as formation of a rib, formation of a microlens, and bonding of a transparent plate are performed for the wafer after the diffusion step. Finally, the wafer is diced and separated into individual pieces, thereby completing an image pickup device. A dicing step will be explained below.

Figure 4:
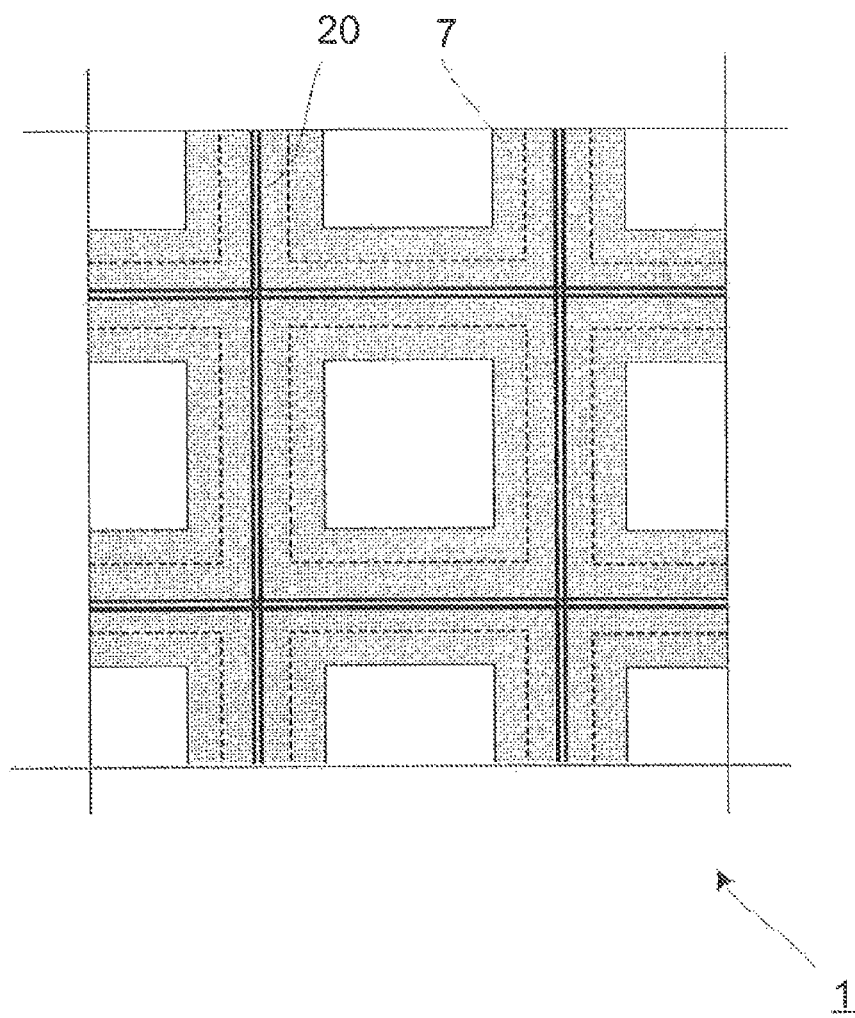
FIG. 4 is a wafer plan view showing a state before separating image pickup devices according to the present invention into individual pieces by dicing.

FIG. 4 is a wafer plan view showing a state before separating image pickup devices according to the present invention into individual pieces by dicing. The image pickup device (chip) explained with reference to FIG. 1 corresponds to a portion surrounded by ribs 7 and scribe lines 20 of a wafer. At the time of separation into individual pieces, a transparent plate 8 (not shown in FIG. 4), the ribs 7, and the wafer 1 integral with one another are cut along the scribe lines 20 into dice. A clearance of about 80 to 150 μm is generally left between image sensors of the wafer, and the region is set as a scribe lane. Each scribe line 20 is provided roughly in the center of the corresponding scribe lane. The rib 7 is provided to extend for 100 to 300 μm on either side from each scribe line 20 and have a width of 200 to 600 μm. With this configuration, the rib 7 with a sufficiently large width is ensured on the four sides of each chip.

Figure 5:
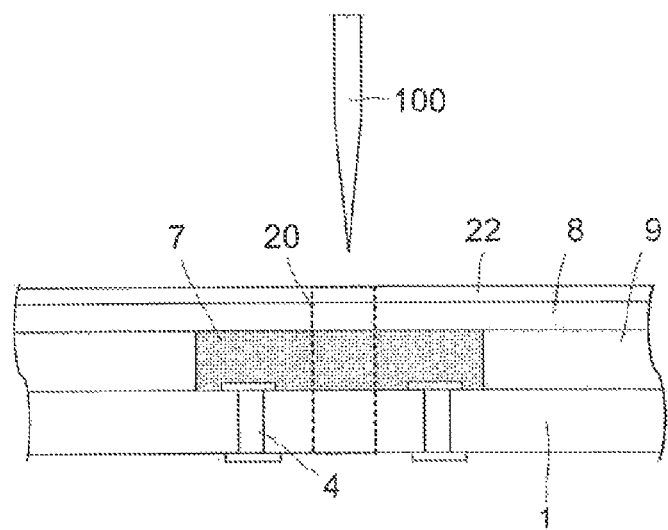
FIG. 5 is a schematic sectional view showing an image pickup device dicing step according to the present invention.

FIG. 5 is a schematic sectional view showing an image pickup device dicing step according to the present invention. The scribe line 20 is provided along the rib 7, and the wafer 1 is cut while moving a rotating blade 100 along the scribe line 20. As for the rib 7, after a protective film 22 is formed on the surface of the transparent plate 8, the transparent plate 8, rib 7, and wafer 1 are sequentially cut along the scribe line 20 and separated into individual chips. At the time of the cutting, chamfering of a surface edge of the transparent plate 8 is simultaneously performed. This makes it possible to achieve reduction in the cost of chamfering, prevent glass chipping, and increase the efficiency of the work of attaching the protective frame 10 shown in FIG. 1. The protective film 22 is removed after the separation into individual pieces.

Figure 6:
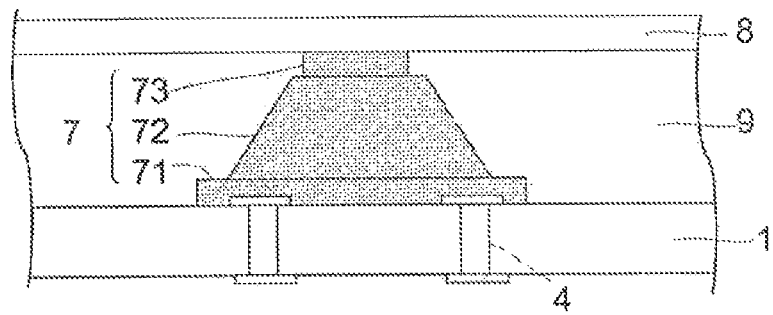
FIG. 6 is a structure sectional view showing the structure of a rib 7 of a different type in an image pickup device according to the present invention.

FIG. 6 is a structure sectional view showing the structure of the rib 7 of a different type. The whole rib 7 is composed of three layers (71, 72, and 73). Of the three layers, the bottom layer 71 covers an electrode without damage, the middle layer 72 has a sloping side, and the top layer 73 is structured to enhance adhesion to the transparent plate 8. Accordingly, the rib 7 is formed to have a funnel-shaped sloping surface which extends forward from the wafer surface side in the void. This improves the optical properties and long-term stability of the device. Since a void 9 (which may be filled with a transparent material 23 later) is formed with the rib 7 between the surface of an image sensor and the transparent plate 8, and the rib 7 acts as a light absorber (light-shielding material) which reduces optical reflection in the void, the rib 7 is desirably a material which harmonizes with the coefficients of thermal expansion of the wafer and transparent plate. For example, formation of such a rib is realized by, e.g., using resin with an added filler such as graphite, alumina, a titanium oxide, or glass fiber.

Figure 7:
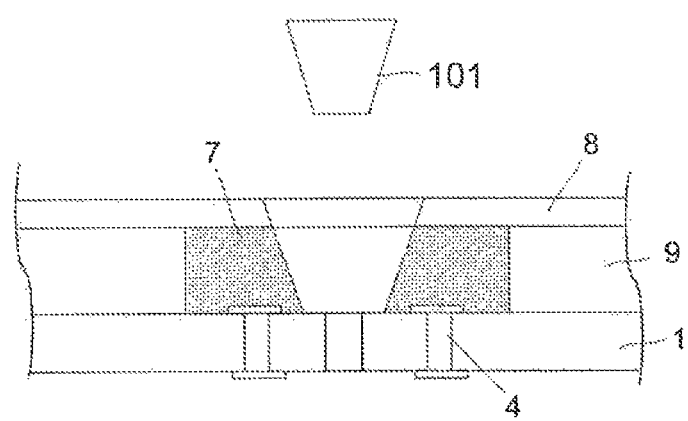
FIG. 7 is a schematic sectional view showing another example of an image pickup device dicing step according to the present invention.

FIG. 7 is a schematic sectional view showing another example of an image pickup device dicing step according to the present invention. As shown in the step sectional view, two-level cutting may be performed using two blades with different thicknesses such that the ribs 7 each have a tapered side. More specifically, the wafer is cut halfway using a thicker blade 102 and cut to the end using a thinner blade 101 (not shown). This improves the workability of a dicing step, increases the bonding area of a protective frame set on four sides of an individually separated image pickup device, and improves the protective stability of a product without forming the recess 11 in an inner surface of the protective frame 10, as shown in FIG. 1.

A method for forming a taper is not limited to the two-level cutting described above, and any other method may be used. For example, laser can be used to make a dicing cut. In this case, cut surfaces of a wafer and a glass plate are smoothed by melting them with laser, and the optical reliability on a sealing surface further improves.

A protective frame can also be formed by integrally forming, e.g., black pasty resin on a wafer using screen printing, ink jet printing, or the like while the wafer is in a so-called half-cut state before separation into individual chips in a scribing step. In this case, it is possible to achieve reduction in the thickness of the protective frame, increase in precision, and further reduction in cost.

Note that if the wafer is covered with the above-described SOG layer instead of the transparent plate 8, since no rib is formed, it is impossible to provide a light-shielded layer. Accordingly, a light-shielding layer 10a may be formed on a side portion along a scribe line using a light absorber or ultraviolet light absorber which does not impair the optical performance of a solid-state image sensor, preferably black rubber or flexible resin mixed with graphite or the like, or a metal-evaporated layer of, e.g., aluminum. Note that the light-shielding layer 10a may be formed on a side of each chip after a scribing step. This makes it possible to omit formation of a rib (and a protective frame) and achieve reduction in cost and further increase in manufacturing efficiency.

Third Embodiment

Figure 9:
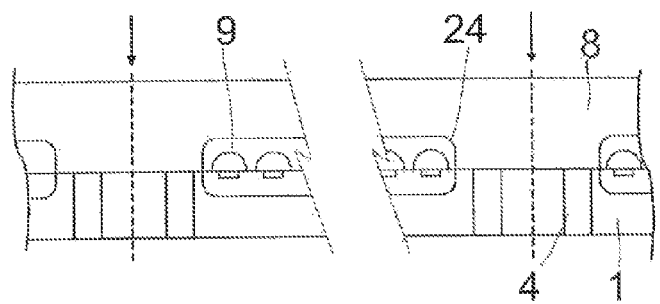
FIG. 9 is a schematic configuration view showing another embodiment of an image pickup device according to the present invention.

FIG. 9 is a schematic configuration view showing another embodiment of an image pickup device according to the present invention. The image pickup device has light-receiving portions 2 formed at a surface portion of a wafer 1 of a chip and a microlens 3 formed corresponding to each of the light-receiving portions 2, as in the case of FIG. 1. Through electrodes 4 are appropriately provided all over the periphery of the wafer 1 and used for supply of power to the light-receiving portions 2 and passing and reception of an electrical signal. Compared with FIGS. 1 and 8, the image pickup device has no rib, and the shape of a transparent plate 8 is different. More specifically, the transparent plate 8 includes a recessed portion 24 whose surface hangs over the light-receiving portions 2 and microlenses 3 on an inner surface side, and a void 9 is formed in the recessed portion 24. Note that arrows and dotted lines in FIG. 9 represent positions at which the wafer 1 is cut by a blade and cutting directions.

The recessed portion 24 can be formed in the transparent plate 8 by chemical etching or thermoforming. As for the shape of the recessed portion 24, it suffices that the depth is about several μmm to several hundred μm and that the bottom surface has a predetermined degree of parallelism with respect to the surface of the transparent plate 8, i.e., the surface of a transparent plate of glass or the like. Structuring the bottom surface to basically have a recess or lens shape is extremely effective against the problem of the exit pupil of a microlens whose degree of practicality decreases with reduction in the size of a solid-state image pickup device.

A non-recessed portion on the inner surface side of the transparent plate 8 of glass or the like, i.e., the inner surface excluding the recessed portion 24 comes into contact with the surface of a predetermined region of the wafer 1 through adhesive. The portion serves as a sealing portion and can also be used as scribe lanes.

Since this embodiment has no rib forming step, it is possible to easily achieve simplification of steps, cost reduction, and improvement in quality stability. At the time of providing a protective frame, it is unnecessary to form the recess 11 as shown in FIG. 1, or formation of the protective frame can be realized by using a layer coated with black paint or the like.

Note that in this case as well, the above-described structures and manufacturing methods can be used in formation of the light-receiving portions 2 at the surface portion of the wafer 1 of the chip, formation of the microlens 3 corresponding to each of the light-receiving portions, formation of the through electrodes 4, a scribing step for forming a CSP structure, the work of chamfering of a surface edge of the transparent plate 8, placement of a protective frame, and the like.

Figure 10:
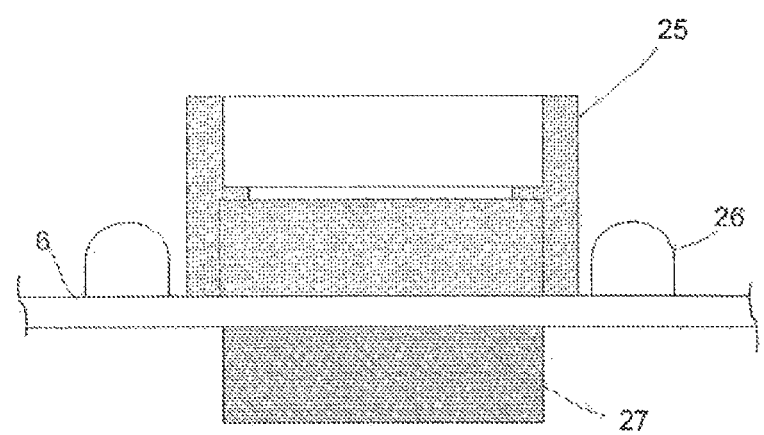
FIG. 10 shows an example of a solid-state image pickup device according to the present invention and is a simple representation of a sectional view of the whole device.
Figure 11:
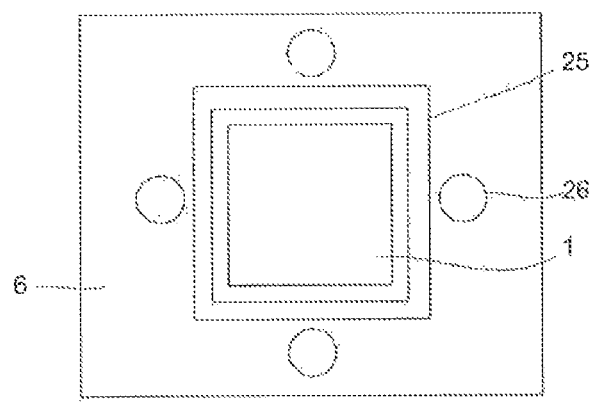
FIG. 11 shows the example of the solid-state image pickup device according to the present invention and is a simple representation of a plan view of the whole device.

FIGS. 10 and 11 show an example of a solid-state image pickup device according to the present invention and are simple representations, respectively, of a sectional view and a plan view of the whole device. In the image pickup device, a hooded protective frame 25 which surrounds the chip 1 as an image sensor is provided, an all-optical source 26 such as a white light-emitting diode (LED) is arranged outside the hooded protective frame 25, and a large-scale integrated circuit device (LSI) 27 which has signal conversion circuits such as an A/D converter and a DSP, a power supply such as a button battery, and a control device are mounted on the other surface of a flexible wiring board.

The hooded protective frame 25 only needs to be capable of blocking direct light from the all-optical source 26 such as a white light-emitting diode so as to prevent light (including reflected light) emitted from an object to be observed within the angle of an opening in the hood from entering the image sensor chip 1. The hooded protective frame 25 is different from the protective frame of the first embodiment in that it has a light source such as the all-optical source 26 including a white light emitting diode, e.g., on the wiring board and is structured to prevent direct light from a light source of this type from reducing the receiving sensitivity of a CCD or the like.

A device of this type can be applied to a small package with a hermetically sealed structure like a so-called capsule, such as a monitoring camera in a dark portion.

The present invention has been described in detail above with reference to the image pickup devices of the embodiments. It is, of course, possible to adapt such an image pickup device into a color image pickup device by providing a color filter under a microlens. Although a CCD is taken as an example, the present invention can also be applied to a CMOS or MOS-type image pickup device. Additionally, the present invention can be applied to an image pickup device formed integrally with a timing generator, AD converter, and DSP. A transparent resin substrate of plastic or the like may be used as a transparent plate. An anti-reflection film or infrared-cut filter may be further formed on the transparent plate. According to the present invention, at the time of construction of an image pickup device in CSP form, it is possible to realize image pickup devices capable of achieving high quality, high stability, and high yield and a method for manufacturing the image pickup devices without degrading the performance.

INDUSTRIAL APPLICABILITY

The present invention realizes a CSP structure obtained by individually sealing image sensors (devices) formed on a wafer in their original chip form and separating the image sensors into single chips by a die cutting technique, in an image pickup device and a method for manufacturing the image pickup device. A sensor which uses a CSP structure is indispensable for further reduction in the weight and size of video equipment such as a video camera, digital camera, or mobile phone camera. In addition to size and thickness reduction, it is possible to improve assembly precision and stably maintain quality.

A small image sensor of this type not only can be optimally used for a capsule structure of medical equipment but also can be widely used in the field of various pieces of equipment and devices having video and image processing functions.

The present invention is not limited to the image pickup devices of the embodiments and can also be applied to a semiconductor light-receiving device which has a mere light-receiving function element.

The invention claimed is:

1. A solid-state image pickup device is a wafer level chip size packaging solid-state image pickup device comprising:
   a wafer,
   a large number of light-receiving portions formed at a surface portion of the wafer,
   a plurality of microlenses, each microlens formed for each of the light-receiving portions,
   through electrodes for performing supply of power to the light-receiving portions and passing and reception of an electrical signal are provided all over a periphery of the wafer, one end of each through electrode is connected to an electrode pad which is connected to a light-receiving element at the surface portion of the wafer, the other end is connected to a back electrode,
   a rib, which serves as a partition portion arranged to surround the microlenses on four sides, is provided on the surface portion of the wafer,
   a transparent plate of optical glass is bonded to an upper surface of the rib with adhesive, and
   a protective frame comprised of a light absorber is set on four sides of the device, provided at each side portion of the device, and extends downward on the sides of the transparent plate, the rib and the wafer, wherein the protective frame completely surrounds the device on four sides with no gaps in the protective frame.

2. The solid-state image pickup device according to claim 1 wherein a recess is formed in an inside of the protective frame near the junction between the rib and the transparent plate.

3. The solid-state image pickup device according to claim 1, wherein the protective frame is a light-shielding layer formed from a light absorber or ultraviolet light absorber.

4. A solid-state image pickup device according to claim wherein, a transparent material with a refractive index lower than that of the plurality of microlenses is formed between the transparent plate and the plurality of microlenses.

5. The solid-state image pickup device according to claim 4, wherein each microlens of the plurality of microlenses is composed of an organic material, an inorganic insulating film of silicon dioxide, a silicon oxynitride film, a silicon nitride film, or an inorganic metal oxide film of a titanium oxide, a tantalum oxide, or a zirconium oxide.

6. The solid-state image pickup device according to claim 4, wherein the transparent material is a translucent low-density dielectric film of a thermoset transparent resin containing distributed micropores, silicon dioxide, a porous silica film, an organic-inorganic hybrid film, a high polymer, and has a refractive index lower than a refractive index of the microlenses.

7. The solid-state image pickup device according to claim 6, wherein the transparent material is composed of a plurality of stacked films.

8. A method for manufacturing a solid-state image pickup device according to claim 1, wherein at the time of formation of the electrode, a hemispherical hole (recess) is formed in advance in a back surface of the wafer by isotropic etching, and a through hole (opening) extending from a bottom of the hole toward an electrode on the surface of the wafer is formed by dry etching, thereby providing the through electrode.

9. A method for manufacturing a solid-state image pickup device according to claim 1, wherein at the time of formation of the through electrode, a large-diameter cylindrical hole (recess) is formed in advance in a back surface of the wafer by dry etching, and a small-diameter through hole (opening) extending from a bottom of the hole toward the surface of the wafer is formed, thereby providing the through electrode.

10. A method for manufacturing a solid-state image pickup device according to claim 1, wherein at the time of formation of the through electrode, within scope of a wafer process for an image sensor, a process is performed in advance of forming a trench in the surface of the wafer, forming a local oxide film, filling the trench with an electrode material to form a wire, and connecting the wire to an electrode pad, and then a substrate is thinned uniformly from a back surface to a lower end of the electrode in the trench.

11. A method for manufacturing a solid-state image pickup device according to claim 1, wherein at the time of formation of the through electrode, within scope of a wafer process for an image sensor, a process is performed in advance of forming a trench in the surface of the wafer, forming a local oxide film, filling the trench with an electrode material to form a wire, and connecting the wire to an electrode pad, and then formation of the through electrode is completed from a hack surface side by forming a hole (recess) extending from a hack surface to the trench, and the back surface is connected to the electrode pad.

12. The solid-state image pickup device according to claim 5, wherein the transparent material is a translucent low-density dielectric film of a thermoset transparent resin containing distributed micropores, silicon dioxide, a porous silica film, an organic-inorganic hybrid film, a high polymer, or the like and has a refractive index lower than a refractive index of the microlenses.

13. A method for manufacturing a solid-state image pickup device according to claim 4, wherein at the time of formation of the electrode, a hemispherical hole is formed in advance in a back surface of the wafer by isotropic etching, and a through hole extending from a bottom of the hole toward an electrode on the surface of the wafer is formed by dry etching, thereby providing the through electrode.

14. A method for manufacturing a solid-state image pickup device according to claim 4, wherein at the time of formation of the through electrode, a large-diameter cylindrical hole is formed in advance in a back surface of the wafer by dry etching, and a small-diameter through hole extending from a bottom of the hole toward the surface of the wafer is formed, thereby providing the through electrode.

15. A method for manufacturing a solid-state image pickup device according to claim 4, wherein at the time of formation of the through electrode, within scope of a wafer process for an image sensor, a process is performed in advance of forming a trench in the surface of the wafer, forming a local oxide film, filling the trench with an electrode material to form a wire, and connecting the wire to an electrode pad, and then a substrate is thinned uniformly from a back surface to a lower end of the electrode the trench.

16. A method for manufacturing a solid-state image pickup device according to claim 4, wherein at the time of formation of the through electrode, within scope of a wafer process for an image sensor, a process is performed in advance of forming a trench in the surface of the wafer, forming a local oxide film, filling the trench with an electrode material to form a wire, and connecting the wire to an electrode pad, and then formation, of the through electrode is completed from a back surface side by forming a hole extending from a back surface to the trench, and the back surface is connected to the electrode pad.

* * * * *

UNITED STATES PATENT AND TRADEMARK OFFICE
CERTIFICATE OF CORRECTION

PATENT NO.       : 8,368,096 B2                                              Page 1 of 1
APPLICATION NO. : 11/813242
DATED            : February 5, 2013
INVENTOR(S)      : Asano et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 703 days.

Signed and Sealed this
First Day of September, 2015

Michelle K. Lee
*Director of the United States Patent and Trademark Office*